United States Patent [19]
Yoshizawa

[11] Patent Number: 6,053,746
[45] Date of Patent: Apr. 25, 2000

[54] CIRCUIT BOARD CONNECTING APPARATUS

[75] Inventor: Tetsuo Yoshizawa, Yokohama, Japan

[73] Assignee: Canon Kabushiki Kaisha, Tokyo, Japan

[21] Appl. No.: 08/917,540

[22] Filed: Aug. 26, 1997

[30] Foreign Application Priority Data

Aug. 30, 1996 [JP] Japan ................................ 8-230333

[51] Int. Cl.⁷ .................................................. H01R 9/09
[52] U.S. Cl. ............................................. 439/67; 439/632
[58] Field of Search .......................... 439/67, 68, 71–73, 439/77, 632

[56] References Cited

U.S. PATENT DOCUMENTS

| | | | |
|---|---|---|---|
| 4,926,549 | 5/1990 | Yoshizawa et al. | 29/876 |
| 5,058,800 | 10/1991 | Yoshizawa et al. | 228/180.2 |
| 5,197,892 | 3/1993 | Yoshizawa et al. | 439/91 |
| 5,600,884 | 2/1997 | Kondo et al. | 29/852 |
| 5,727,955 | 3/1998 | Tsubakihara | 439/71 |
| 5,730,619 | 3/1998 | Hamlin | 439/493 |

*Primary Examiner*—Khiem Nguyen
*Attorney, Agent, or Firm*—Fitzpatrick, Cella, Harper & Scinto

[57] ABSTRACT

A first terminal portion constructed by a plurality of contact pins of a first circuit board and a second terminal portion constructed by a plurality of contact pins of a second circuit board are joined in a housing of a connector. The connector has a presser for applying a pressing force to a joint portion. The presser applies the pressing force, thereby joining the plurality of contact pins of the first terminal and the plurality of contact pins of the second terminal through soft metal projections. Thus, a joint area of the contact terminal portion can be increased and the reliability of the joining can be improved. Since the circuit boards are positioned, the terminal portions of the circuit boards can be accurately joined.

8 Claims, 3 Drawing Sheets

CIRCUIT BOARD CONNECTING APPARATUS

BACKGROUND OF THE INVENTION

1. Field of the Invention

The invention relates to a circuit board connecting apparatus for electrically connecting a circuit board and another circuit board.

2. Related Background Art

Hitherto, as a method of connecting a terminal portion of a circuit board and another terminal portion, there is a method by soldering, a method by a connector, or the like. Among them, a connector is generally used as a detachable device. FIG. 3 shows an example of such a connecting method by the connector. FIG. 3 is a cross sectional view showing a state in which a circuit board 500 and a circuit board 501 are connected by a connector 502.

The connector 502 has a construction such that a contact 504 of a sandwiching clip shape which has a spring property and is formed by soldering phosphor bronze with nickel is arranged in a housing 503. A terminal 505 of the contact 504 extending to the outside while penetrating a wall surface of the housing 503 is soldered to a terminal 506 of the circuit board 500 by a solder 507.

On the other hand, a terminal portion 508 of the circuit board 501 is inserted into the contact 504 from the opening port side of the connector 502. The contact 504 has a spring property and sandwiches the circuit board 501, so that the contact 504 elastically comes into pressure contact with the terminal portion 508 of the circuit board 501. The terminal portion 508 of the circuit board 501 and the contact 504 are electrically connected. Consequently, the terminal portion 506 of the circuit board 500 and the terminal portion 508 of the circuit board 501 are electrically connected through the contact 504 of the connector 502.

FIGS. 4A and 4B show cross sectional views of another conventional example. FIG. 4A shows a state before a connector is joined. FIG. 4B shows a state after the connector was joined.

According to a connector 512 of the conventional example shown in FIGS. 4A and 4B, a contact 514 made up of a contact member having a mountain-like cross sectional shape is provided in a housing 513. The housing 513 has a movable portion 518 which is rotatable by a hinge portion H and has a structure such that the contact 514 is depressed downward by rotating the movable portion 518 in the direction shown by an arrow from an opening state.

A terminal portion 515 of the contact 514 is soldered to a terminal 516 of a circuit board 510. A circuit board 511 is inserted into an opening port of the connector 512. After that, the movable portion 518 of the housing 513 of the connector 512 is rotated in the direction shown by the arrow.

When the movable portion 518 is rotated in the arrow direction, the movable portion 518 is fixed and enters a state shown in FIG. 4B.

In the fixed state shown in FIG. 4B, a force is applied to a terminal portion 517 of the circuit board 511 by a spring force of the contact 514, so that the contact 514 and terminal portion 517 are electrically connected.

The terminal portion 516 of the circuit board 510 is, therefore, connected to the terminal portion 517 of the circuit board 511 through the contact 514 of the connector 512.

However, the foregoing conventional method of joining the circuit boards by the connector has the following problems.

Although the contact of the connector is made of a copper alloy material having a good conductivity such as phosphor bronze, titanium copper, chromium copper, or the like having a spring property, it is relatively hard.

The terminal portion of the circuit board is made of copper or copper with a solder of gold, Ni, tin, or the like.

The contact portion has many concave and convex portions when it is seen from a micro precision. However, as a degree of concave and convex portions of the contact portion of the connector is reduced and as a joint area is increased, a connector which enables a larger current to flow can be formed.

It is, therefore, necessary to increase the joint area and to increase a contact pressure. However, in order to raise the contact pressure, not only the spring material but also the plate have to be thickened and the structure has to be enlarged in size. Such a structure is difficult in the conventional connector.

Particularly, in the conventional connector, as the connector has a large number of pins and a narrow pitch, the joint area decreases and the contact pressure also decreases, so that the reliability of the joint deteriorates.

The terminal of the circuit board which is inserted into the connector is positioned and formed while using an external shape as a reference. The terminal portion corresponds to the contact in a one-to-one relational manner. Therefore, when a variation occurs in the external dimensions of the terminal of the circuit board which is inserted into the connector and patterns of the external shape and the circuit board are deviated, a problem such that the terminal portion of the circuit board and the contact of the connector are not matched occurs.

Particularly, the above problem is further remarkable in the connector having a larger number of pins and a narrower pitch. It will be obviously understood that if it is intended to solve those problems, costs rise.

SUMMARY OF THE INVENTION

It is an object of the invention to solve the foregoing problems and to provide a connecting apparatus of circuit boards in which in a joint of terminal portions of the circuit boards, a joint area is increased and the reliability of the joint is improved.

Another object of the invention is to provide a connecting apparatus of circuit boards which can accurately join terminal portions of the circuit boards by positioning the circuit boards.

The above and other objects and features of the present invention will become apparent from the following detailed description and the appended claims with reference to the accompanying drawings.

DETAILED DESCRIPTION OF THE PREFERRED EMBODIMENTS

Embodiment of the invention will now be described hereinbelow with reference to the drawings.

Figure 1:
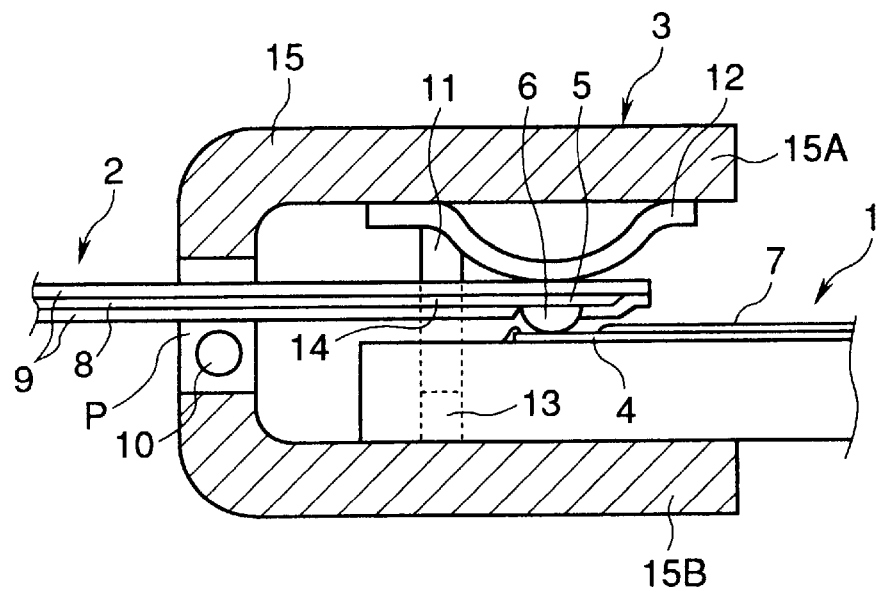
FIG. 1 is a cross sectional view of a circuit board connecting apparatus according to the first embodiment of the invention.

FIG. 1 shows a circuit board connecting apparatus according to the first embodiment of the invention. According to the circuit board connecting apparatus, a terminal portion 4 of a circuit board 1 and a terminal portion 5 of a circuit board 2 are joined by a connector 3 through a projecting member (hereinafter, referred to as a bump) 6. In FIG. 1, the circuit board 1 is a both-side board having a thickness of 1 mm of FR-4 of the ANSI (NEMA) standard. In the terminal portion 4, gold is soldered on a copper foil so as to have a thickness of 0.1 $\mu$m. A portion near the terminal portion 4 is covered with a soldering resist 7 and is insulated. The terminal portion 4 has a terminal of 20 pins and its pitch is equal to 0.2 mm. Positioning pin holes 13 are formed at two positions near the terminal portion 4.

On the other hand, the circuit board 2 is a flexible printed board, both surfaces of a copper foil 8 are adhered with polyimide 9 and has a thickness of about 120 $\mu$m. In the terminal portion 5, the copper foil 8 is used as a cathode and is soldered with gold and the bump 6 which has an arbitrary thickness of about 50 to 100 $\mu$m and is made of a soft metal material is formed on the surface of the terminal portion 5. The number of pins and the pitch of the terminal portion 5 are the same as those of the terminal portion 4 of the circuit board 1 except that positioning pin holes 14 are formed at the positions which face the positioning pin holes 13 of the circuit board 1.

A housing 15 of the connector 3 is formed so as to have a structure like what is called a clip such that a pin 10 is pierced into minor side portions of a first housing portion 15A and a second housing portion 15B each having almost the same L-shaped cross sectional shape and the first and second housing portions 15A and 15B are rotatable around the pin 10 as a fulcrum. Fixed claws (not shown) are formed at front and rear positions of the paper surface so that the housing 15 can be fixed at a position shown in FIG. 1. A positioning pin 11 extending toward the second housing 15B is formed on the inner surface side of the first housing portion 15A. A pressing spring 12 which is made of a plate spring having an almost semicircular cross sectional shape is provided. Further, an opening portion P into which the circuit board 2 is penetrated is formed in the rear wall portion of the housing 15.

The positioning pin 11 is attached to the first housing portion 15A so that it can be easily inserted into the positioning pin hole 13 formed in the circuit board 1 and the positioning pin hole 14 formed in the circuit board 2 at a position corresponding to the positioning pin hole 13. However, the pin 11 is movable. In the joint state of the circuit board shown in FIG. 1, an insertion tip of the positioning pin 11 is set to a length such that it is inserted to a position corresponding to the half of the thickness of circuit board 1.

The pressing spring 12 is made of phosphor bronze and is set to a thickness such that when it is joined, it provides an arbitrary load. In the embodiment, the load is set to an arbitrary value within a range of 10 to 100 g per pin. The pressing spring 12 is constructed so that only one side in the length direction is fixed to the inner surface of the first housing 15A of the connector 3 and the other side is not fixed in a manner such that when the spring is depressed, it can be easily deformed.

In the foregoing embodiment, both of the housings 15A and 15B of the housing 15 of the connector 3 are opened, the circuit board 1 is inserted into the housing 15 from the opening port side, the circuit board 2 is inserted into the housing 15 through the opening portion P, and the positions of the circuit boards 1 and 2 are matched so that the positioning pin hole 13 of the circuit board 1 and the positioning pin hole 14 of the circuit board 2 are almost aligned to the positioning pin 11. For example, when the second housing portion 15B is fixed and the first housing portion 15A is rotated toward the second housing portion 15B, the positioning pin 11 is pierced through the positioning pin hole 14 of the circuit board 2 while performing, for example, a pivoting operation and, subsequently, is pierced into the positioning pin hole 13 of the circuit board 1. In this instance, therefore, the circuit boards 1 and 2 are freely moved and are certainly positioned. The terminal portion 5 of the circuit board 2 is positioned onto the terminal portion 4 of the circuit board 1. The bumps 6 formed on the surfaces of a plurality of pins of the terminal portion 5 are aligned and come into contact with each pin of the terminal portion 4. When the first housing portion 15A is further depressed, a pressing force of the pressing spring 12 is applied to each bump 6, the bumps 6 are joined to the pins of the terminal portion 4, and both of the housing portions are fixed by fixing claws (not shown).

Figure 3:
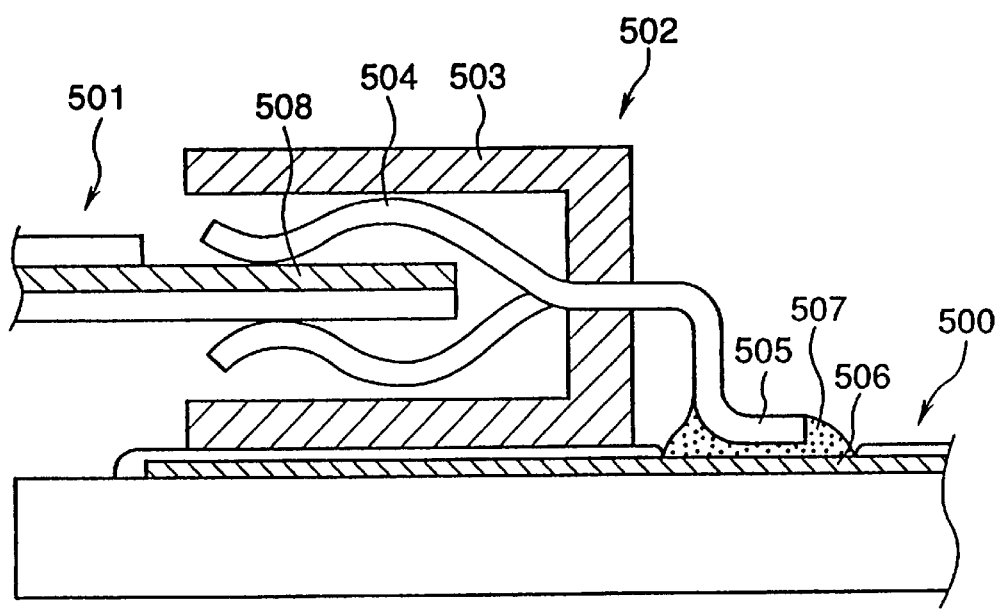
FIG. 3 is a cross sectional view showing a conventional circuit board connecting apparatus.
Figure 4A:
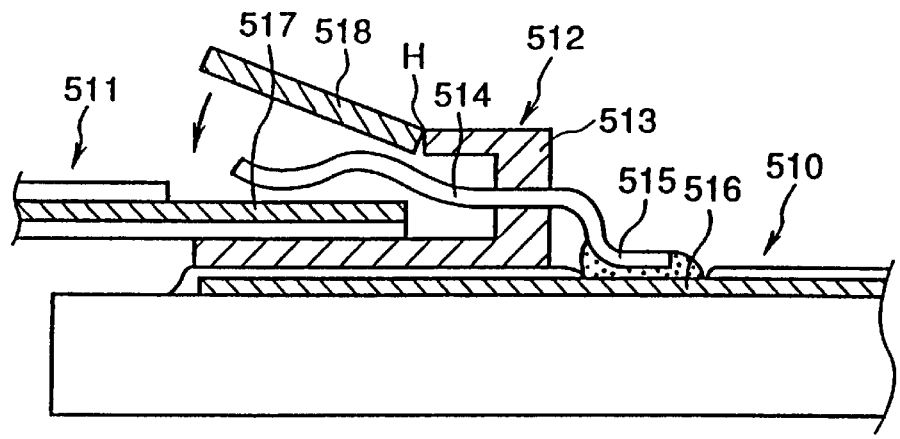
FIG. 4A shows another example of the conventional circuit board connecting apparatus and is a cross sectional view showing a state before fixing.
Figure 4B:
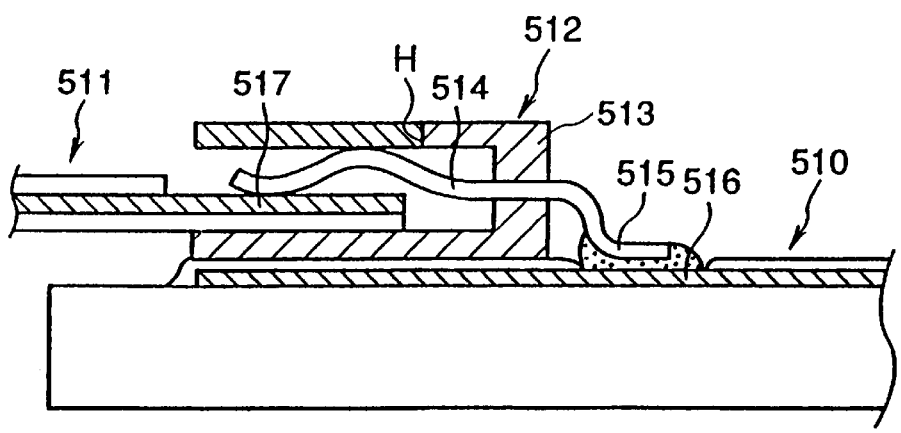
FIG. 4B is a cross sectional view showing a state in which the circuit board connecting apparatus shown in FIG. 4A is fixed.

In the embodiment, since the terminal portion 4 of the circuit board 1 to be joined and the terminal portion 5 of the circuit board 2 are directly joined, the contacts as in the conventional apparatuses shown in FIGS. 3, 4A and 4B are unnecessary, the apparatus can be miniaturized, the space that is required to solder the contact onto the circuit board is unnecessary, and the circuit density can be increased by an amount of the unnecessary space.

Since the bump 6 is made of soft metal, when it is joined, the bump 6 is deformed. Even if there are concave and convex portions between the pins and the joint surface, they are buried by the bumps. Thus, the joint area increases and the joint reliability can be improved.

Since the circuit boards are positioned by piercing the positioning pin 11 serving as a part of the connector into the positioning pin holes, even if the terminal portion has a narrow pitch and a number of pins, they can be joined at a high reliability and the remarkable effect is obtained.

The second embodiment of the invention will now be described with reference to FIG. 2.

Figure 2:
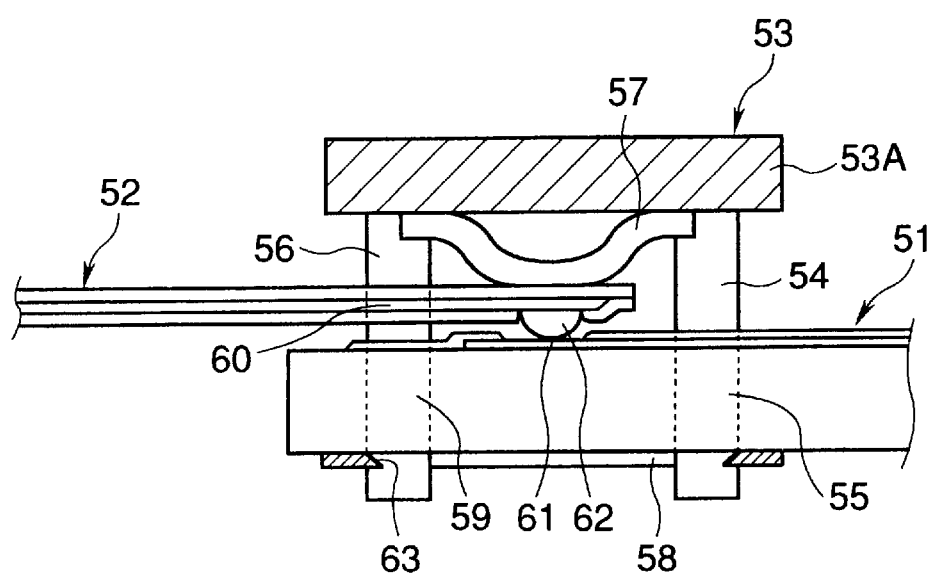
FIG. 2 is a cross sectional view of a circuit board connecting apparatus according to the second embodiment of the invention.

According to the circuit board connecting apparatus shown in FIG. 2, as for a circuit board 52, a positioning pin hole 60 is formed in a manner similar to the circuit board 2 used in the first embodiment and a bump 62 made of a soft metal material is provided for each pin of the terminal portion. As for a circuit board 51, a positioning pin hole 55 into which a positioning pin 54 is inserted and a positioning pin hole 59 into which a positioning pin 56 is inserted are formed on both of the front and rear sides in the width direction of a terminal portion 61.

A connector 53 is constructed by: a housing main body 53A of a flat plate shape in which a pair of positioning pins 54 and a pair of positioning pins 56 are attached at four corners; and a stopper plate 58 having hole portions (not shown) adapted to be come into engagement with notch portions 63 for engagement formed in the lower portions of those four positioning pins. A pressing spring 57 is attached to the inner surface side of the housing main body 53A along the width direction in a manner similar to the first embodiment while fixing only one side of the pressing spring 57.

In the embodiment, terminal portions of the circuit boards 51 and 52 are aligned, the two positioning pins 56 in front of the housing main body 53A are pierced through the positioning pin hole 60 of the circuit board 52 and the positioning pin hole 59 of the circuit board 51, and the two positioning pins 54 behind the housing 53A are pierced through the positioning holes 55 of the circuit board 51. Thus, the bump 62 of the circuit board 52 is accurately positioned to each pin of the terminal portion 61 of the circuit board 51. Hole portions (not shown) of the stopper plate 58 are fitted into the positioning pins 54 and 56 from the rear surface side of the circuit board 51. When the housing main body 53A is further depressed, a pressing force from the pressing spring 57 which is in contact with almost the top of the bump 62 is applied to the bump 62 in a manner similar to the first embodiment. Each bump 62 is joined to each pin of the terminal portion 61 of the circuit board 51. The stopper plate 58 comes into engagement with the notch portion 63 for engagement of each of the positioning pins 54 and 56, so that the stopper plate 58 is fixed to the housing main body 53A. In this instance, the notch portions 63 for engagement are provided at positions such that the pressing spring 57 applies a proper load (arbitrary load within a range from 10 to 100 g per pin) to the pin of the terminal portion 61 of the circuit board 51 and to the bump 62 at the position shown in FIG. 2.

In the embodiment shown in FIG. 2, a joint of good reliability is derived in a manner similar to the first embodiment and the apparatus can be further miniaturized than the conventional connector. The structure is more simplified than the first embodiment.

The embodiments have been described above. However, the invention is not limited to the above embodiments but can be also applied to the following apparatuses. As a circuit board, for instance, a resin circuit board, a ceramics circuit board, a metal core circuit board, a silicon circuit board, a flexible circuit board, or the like can be mentioned. In such circuit boards, one or more terminal portions are provided on the surface, a wiring is formed on an insulative material or on a board obtained by performing an insulating process to the metal surface or a wiring is formed in the board in accordance with circumstances, a through hole or viahole is formed, and pattern layers are electrically connected by the through hole or viahole.

As a material of the projection (bump) of the terminal portion of the circuit board of the invention, a material such as Au, Ag, Pt, Sn, Ni, or the like, or an alloy of them can be mentioned. As a method of manufacturing those metals or alloy, generally, an evaporation deposition, a thermal spraying, or a method by cladding with other material can be used. To make the projection relatively soft, in addition to a method of refining during the manufacturing steps, even when the projection is made relatively soft by a method of enlarging a crystal grain by annealing or the like after completion of the manufacturing steps or the like and a joint pressure is reduced in case of joining, the joint area is increased, thereby improving the reliability of the joining.

As for the projection of the terminal portion, it is possible to protrude (press out) the back surface of the surface of the terminal portion of the circuit board toward the terminal portion side and to form a convex shape. In this case, the back surface of the surface of the terminal portion has a concave shape.

According to the invention, the circuit boards are joined by confronting the terminal portions thereof, so that the apparatus can be miniaturized. However, in this instance, it is desirable that the positioning holes are formed at relatively near positions other than the terminal portions.

As a pressing mechanism of the connector, a pressing method by a spring force by a spring member, a pressing method by an elasticity of a material, or a pressing method by a magnet can be mentioned. However, it is desirable to select a method and a material which has excellent creep characteristics.

According to the invention, in the joint of the terminal portions of the circuit boards, the bump of a relatively soft material is provided for the terminal portion of one circuit board and is joined, so that the large joint area can be obtained and the joint reliability is improved. Moreover, by directly joining the terminal portions of the circuit boards, the connector can be miniaturized.

According to the invention, a connector such that even if the external dimensions are deviated from the pattern of the circuit board, the terminal portions can be accurately positioned, a large contact area can be obtained, and high reliability can be provided. As the connector has a narrower pitch and a larger number of pins, the above effect is increased.

What is claimed is:

1. A circuit board connecting apparatus comprising:
   a first circuit board with a first terminal having a plurality of contact pins;
   a second circuit board with a second terminal having a plurality of contact pins;
   said second terminal being provided at a position corresponding to said first terminal of said first circuit board;
   soft metal projections formed on surfaces of said plurality of contact pins of either one of said first and second terminals so as to provide a contact area; and
   a connector for joining said plurality of contact pins of said first terminal and said plurality of contact pins of said second terminal through said soft metal projections,
   wherein said connector includes pressing means for applying a pressing force to either one of said first and second circuit boards so as to deform said soft metal projections and increase the contact area, thereby joining said plurality of contact pins of said first terminal and said plurality of contact pins of said second terminal with pressure through said soft metal projections.

2. An apparatus according to claim 1, wherein said connector has positioning pins and hole portions for positioning said positioning pins by fitting said positioning pins into hole portions formed in said first and second circuit boards.

3. An apparatus according to claim 2, wherein said connector includes a first housing and a second housing, with each said housing having one end side set to a rotatable rotary portion and a second end side opened.

4. A circuit board connecting apparatus comprising:
   a first circuit board with a first terminal having a plurality of contact pins;
   a second circuit board with a second terminal having a plurality of contact pins;
   said second terminal being provided at a position corresponding to said first terminal of said first circuit board;
   soft metal projections formed on surfaces of said plurality of contact pins of either one of said first and second terminals; and a connector for coining said plurality of contact pins of said first terminal and said plurality of contact pins of said second terminal through said soft metal projections, said connector having positioning pins and hole portions for positioning said positioning pins by fitting said positioning pins into hole portions formed in said first and second circuit boards, and said connector including a first housing and a second housing, with each said housing having one end side set to a rotatable rotary portion and a second end side opened, wherein said connector further includes pressing means for applying a pressing force to either one of said first and second circuit boards, thereby joining said plurality of contact pins of said first terminal and said plurality of contact pins of said second terminal with a pressure through said soft metal projections, wherein an opening portion is formed in said rotary portion of each of said first and second housings, with one of said first and second circuit boards inserted from the opened end side of said first and second housings, and the other of said first and second circuit boards inserted from the opening portion of said rotary portion of said first and second housings.

5. A circuit board connecting apparatus comprising:

a first circuit board with a first terminal having a plurality of contact pins;

a second circuit board with a second terminal having a plurality of contact pins;

said second terminal being provided at a position corresponding to said first terminal of said first circuit board;

soft metal projections formed on surfaces of said plurality of contact pins of either one of said first and second terminals; and a connector for joining said plurality of contact pins of said first terminal and said plurality of contact pins of said second terminal through said soft metal projections, said connector having positioning pins and hole portions for positioning said positioning pins by fitting said positioning pins into hole portions formed in said first and second circuit boards, and said connector including a first housing and a second housing, with each said housing having one end side set to a rotatable rotary portion and a second end side opened, wherein said connector has pressing means for applying a pressing force to either one of said first and second circuit boards, and said pressing means applies the pressing force, thereby joining said plurality of contact pins of said first terminal and said plurality of contact pins of said second terminal with a pressure through said soft metal projections, wherein said pressing means is provided for either one of said first and second housings.

6. An apparatus according to claim 2, wherein said connector includes a housing main body having positioning pins; and stopper members which come into engagement and attach to tip portions of said positioning pins fitted into hole portions formed in said first and second circuit boards.

7. An apparatus according to claim 6, wherein said pressing means is provided for said housing main body.

8. A circuit board connecting apparatus comprising:

a first circuit board with a first terminal;

a positioning hole formed in said first circuit board;

a second circuit board with a second terminal;

a positioning hole formed in said second circuit board and said second terminal being provided at a position corresponding to the first terminal of said first circuit board;

a soft metal projection formed on a surface of either one of said first and second terminals and providing a contact area; and a connector for joining said first and second terminals through said soft metal projection, wherein said connector includes positioning pins for positioning by fitting into the positioning holes of said first and second circuit boards and pressing means for applying a pressing force to either one of said first and second circuit boards so as to deform said soft metal projections and increase the contact area, thereby joining said first and second terminals with pressure through said soft metal projection.

* * * * *

UNITED STATES PATENT AND TRADEMARK OFFICE
CERTIFICATE OF CORRECTION

PATENT NO. : 6,053,746
DATED       : April 25, 2000
INVENTOR(S): TETSUO YOSHIZAWA It is certified that error appears in the above-identified patent and that said Letters Patent is hereby corrected as shown below:

COLUMN 3:

Line 7, "Embodiment" should read --Embodiments--.

Signed and Sealed this

Tenth Day of April, 2001

Attest:

NICHOLAS P. GODICI

Attesting Officer      Acting Director of the United States Patent and Trademark Office